United States Patent [19]
Ichigi et al.

[11] Patent Number: 5,202,577
[45] Date of Patent: Apr. 13, 1993

[54] LEADFRAME HAVING A PARTICULAR DAM BAR

[75] Inventors: Kikuo Ichigi; Soichiro Shimamura; Masahiro Fuse, all of Tokyo, Japan

[73] Assignee: Dai Nippon Printing Co., Ltd., Tokyo, Japan

[21] Appl. No.: 651,144

[22] Filed: Feb. 6, 1991

[30] Foreign Application Priority Data

Feb. 6, 1990 [JP] Japan .................................. 2-26346
Dec. 27, 1990 [JP] Japan .................................. 2-407876

[51] Int. Cl.⁵ ...................... H01L 23/48; H01L 23/54
[52] U.S. Cl. .................................... 257/667; 257/666
[58] Field of Search ................. 357/70; 437/220, 217

[56] References Cited
FOREIGN PATENT DOCUMENTS

| | | | |
|---|---|---|---|
| 62-22464 | 1/1987 | Japan | 357/70 |
| 62-200749 | 9/1987 | Japan | 357/70 |
| 62-200750 | 9/1987 | Japan | 357/70 |
| 63-702947 | 8/1988 | Japan | 357/70 |
| 1-125963 | 5/1989 | Japan | 357/70 |
| 1-201945 | 8/1989 | Japan | 357/70 |
| 1-296651 | 11/1989 | Japan | 357/70 |
| 2-97048 | 4/1990 | Japan | 357/70 |
| 2-205060 | 8/1990 | Japan | 357/70 |

Primary Examiner—Rolf Hille
Assistant Examiner—S. V. Clark
Attorney, Agent, or Firm—Dellett, Smith-Hill and Bedell

[57] ABSTRACT

A leadframe comprising a thin-walled portion that is formed in a dam bar portion or a portion that extends from the dam bar portion to a pair of inner leads which are adjacent thereto. By cutting the dam bar portion along the thin-walled portion, the stress that is imposed on a cutting punch is reduced. Thus, it is possible to extend the lifetime of the cutting punch and also to minimize the shear droop formed on the cut surface. The leadframe further has a thick-walled portion formed at the position where the thin-wall portion is formed. The thick-walled portion serves to support the thin-walled portion when the dam bar portion is cut off, thus preventing the dam bar portion from tilting. Accordingly, the dam bar cutting operation can be conducted stably without undesired movement of the dam bar portion, and the stress that is imposed on the leadframe can be controlled so as to be well balanced.

7 Claims, 20 Drawing Sheets

Dam bar cutting direction

Dam bar cutting direction

LEADFRAME HAVING A PARTICULAR DAM BAR

BACKGROUND OF THE INVENTION

The present invention relates to a leadframe which is used as an assembly member of electronic parts, for example, a semiconductor device.

The packaging density of semiconductor devices has been increasing in recent years. Under such circumstances, the external size of packages of semiconductor elements has been decreasing year by year. In consequence, leadframes that are used as assembly members of semiconductor devices have also decreased in size. More specifically, the distance from a resin molding line to a dam bar, which was 0.25 mm in the past, has decreased to about 0.18 mm. Thus, the dam bar and the package line have become closer to each other.

In addition, the pitch of outer leads of leadframes has been decreasing year by year, i.e., from 0.65 mm to 0.55 mm, 0.5 mm and 0.35 mm. With the decrease in the pitch of outer leads, the thickness of outer leads has also decreased, i.e., 0.25 mm to 0.07 mm.

Under such circumstances, outer leads are produced with a width of from 0.3 mm to 0.1 mm, so that dam bars are cut off with a considerably thin cutting punch of 0.25 mm to 0.08 mm in width.

However, since the dam bars of the conventional leadframes have a relatively large thickness, such a thin cutting punch is likely to chip off, so that the lifetime of the cutting punch is shortened.

If the cutting punch chips off, a large shear droop a is induced on the cut surface of the dam bar, as shown in FIG. 21. Such a shear droop a forms large burr, resulting in degradation of the external appearance.

In addition, since the dam bar is distorted when it is cut, the leadframe may be deformed.

In addition, when the resin material that is present in between the dam bar and the molding line is cut, the resin burr may scatter, causing problems.

SUMMARY OF THE INVENTION

It is an object of the present invention to provide a leadframe which is designed so that it is possible to extend the lifetime of the dam bar cutting punch and prevent occurrence of shear droop on the cut surfaces of dam bars.

It is another object of the present invention to provide a leadframe which is designed so that it is possible to reduce the deformation of the leadframe that is caused by the dam bar cutting operation.

It is still another object of the present invention to provide a leadframe which is designed so that it is possible to prevent scattering of the molding resin material which would otherwise occur when dam bars are cut.

To attain the above-described objects, the present invention provides a leadframe having a dam bar portion formed between each pair of adjacent leads each comprising an inner lead and an outer lead, which comprises a thin-walled portion that is formed in either the dam bar portion or a portion that extends from the dam bar portion to the neighboring inner leads.

The thin-walled portion may be formed with a part of the dam bar portion which is closer to the outer leads being left as it is.

The thin-walled portion may be formed with a part of the dam bar portion which is closer to the inner leads being left as it is.

In addition, the present invention provides a leadframe having a dam bar portion formed between each pair of adjacent leads each comprising an inner lead and an outer lead, which comprises: a thin-walled portion that is formed at least in the dam bar portion with a part of the dam bar portion which is closer to the outer or inner leads being left as it is; and a thick-walled portion that is formed at the position of the dam bar portion where the thin-walled portion is formed, the thick-walled portion being disposed between the pair of adjacent inner or outer leads.

The thick-walled portion may be formed to project toward the thin-walled portion from a part of the dam bar portion which is closer to the outer or inner leads in the form of a peninsula.

The thick-walled portion may be formed to project inside the thin-walled portion in the form of an island.

The thin-walled portion may be a half-etched portion that is formed by half-etching process.

The thin-walled portion may be formed with a notch.

The thin-walled portion is formed on at least one of the obverse and reverse sides of the leadframe.

Since a thin-walled portion is formed in the dam bar portion or a portion that extends from the dam bar portion to a pair of inner leads which are adjacent thereto, the stress that is imposed on a cutting punch is reduced by cutting the dam bar portion along this thin-walled portion. Thus, it is possible to extend the lifetime of the cutting punch and also to minimize the shear droop formed on the cut surface.

The thick-walled portion, which is formed at the position where the thin-wall portion is formed, serves to support the thin-walled portion when the dam bar portion is cut off, thus preventing the dam bar portion from tilting. Accordingly, the dam bar cutting operation can be conducted stably without undesired movement of the dam bar portion, and the stress that is imposed on the leadframe can be controlled so as to be well balanced. Thus, the dam bar portion can be cut off accurately without deforming the leadframe.

In addition, if the thin-walled portion is formed by half-etching process, when the resin material that is present in between the dam bar portion and the molding line is cut off by punching (i.e., resin cutting), the resin material on the half-etched portion is brought into close contact with the surface roughened by the half-etching process and hence the adhesion of the resin material is enhanced, so that the scattering of the resin material by resin cutting is controlled effectively.

Still other objects and advantages of the invention will in part be obvious and will in part be apparent from the specification.

The invention accordinly comprises the features of construction, combinations of elements, and arrangement of parts which will be exemplified in the construction hereinafter set forth, and the scope of the invention will be indicated in the claims.

BRIEF DESCRIPTION OF THE DRAWINGS

FIG. 2 shows a cross-section of a dam bar, in which.

FIG. 3 shows cross-sections of dam bars, in which.

FIG. 7 shows cross-sections of dam bars, in which.

FIG. 10 shows cross-sections of dam bars, in which.

FIG. 15 is a sectional view taken along the line XV—XV in FIG. 14, in which.

FIG. 18 is a sectional view taken along the line XVIII—XVIII in FIG. 17, in which.

FIG. 21 is a sectional view of a dam bar of a conventional leadframe, in which.

DESCRIPTION OF THE PREFERRED EMBODIMENTS

Embodiments of the present invention will be described below with reference to the accompanying drawings.

Figure 1:
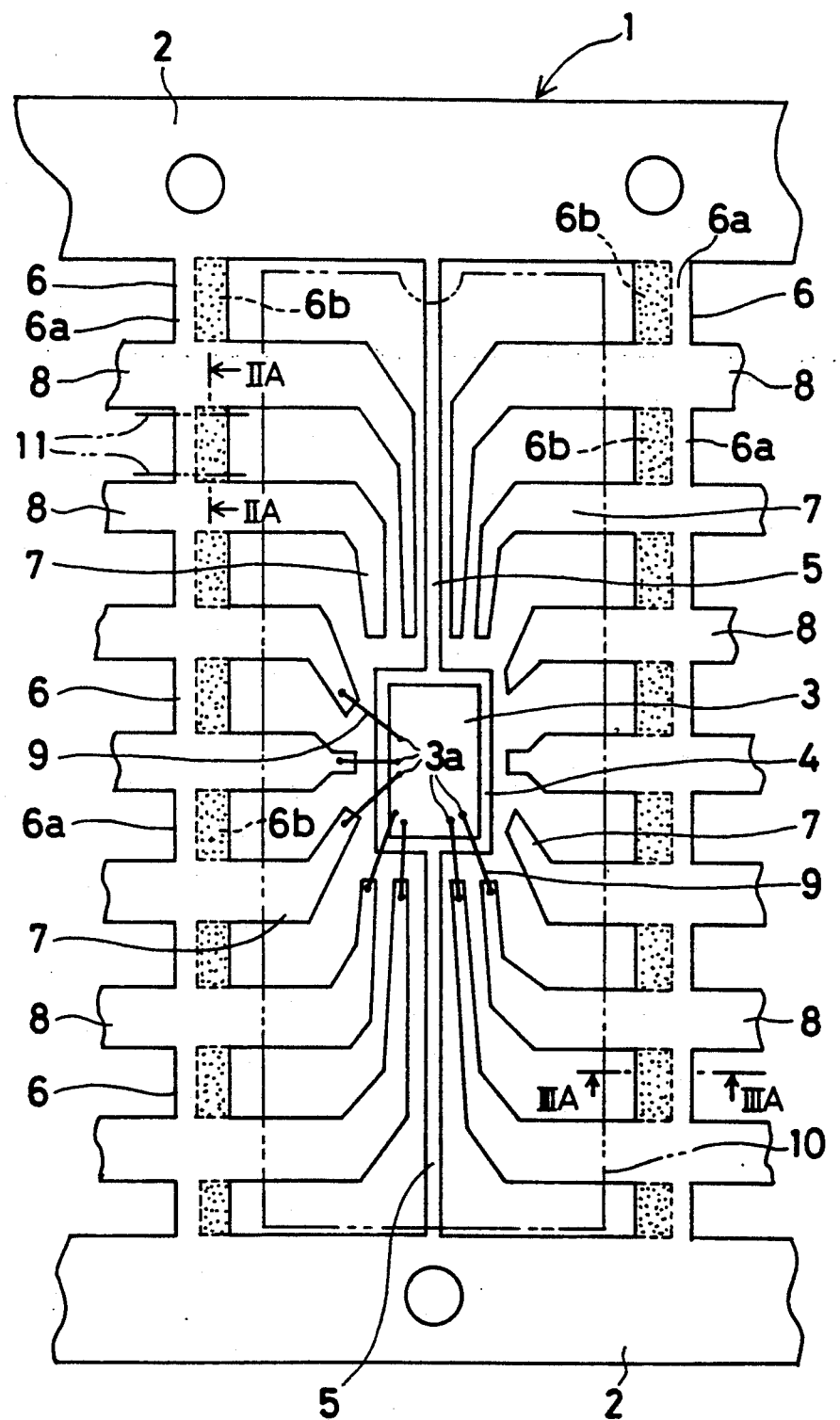
FIG. 1 is a plan view of one embodiment of the leadframe according to the present invention.

Referring to FIG. 1, a leadframe 1 is a DIP (Dual Inline Package) type one that is made of a metal, for example, a copper alloy, Alloy 42, etc. [in this embodiment the leadframe 1 is formed by use of a sheet of Alloy 42 with a predetermined thickness (e.g., 0.15 mm)]. The leadframe 1 has a pair of parallel rails 2 which are disposed at the upper and lower ends, respectively. In between the pair of rails 2 is disposed a die pad 4 for mounting a semiconductor element 3. The die pad 4 is supported by the pair of rails 2 through a pair of die pad supports 5.

In addition, a pair of dam bars 6 extend between the pair of rails 2 in such a manner as to face each other across the die pad 4. Each of the dam bars 6 is provided with leads comprising a plurality (7 in the illustrated embodiment) of inner leads 7 and the same number of outer leads 8. These dam bars 6 also serve to stop the flow of resin material to the inner leads 7 and outer leads 8 extend parallel to the rails 2, except that the outer leads 8. The distal ends of the inner leads 7 are properly bent so as to face the die pad 4.

The electrodes of the semiconductor element 3 mounted on the die pad 4 are bonded to the corresponding terminals of the inner leads 7 through respective wires 9.

Each dam bar 6 is half-etched to a predetermined depth (e.g., 0.08 mm) from the reverse side of the leadframe 1 with respect to the side where the semiconductor element 3 is mounted in such a manner that at a portion 6a of the dam bar 6 which is closer to the outer leads 8 is left unetched with a predetermined length (e.g., 0.05 mm), while the lower half of the other portion 6b is etched. Accordingly, the portion 6b, which is a half-etched portion of the dam bar 6, forms a thin-walled portion with a relatively small thickness.

The following is a description of a process of packaging the semiconductor element 3 by use of the leadframe that is formed as described above.

Figure 2A:
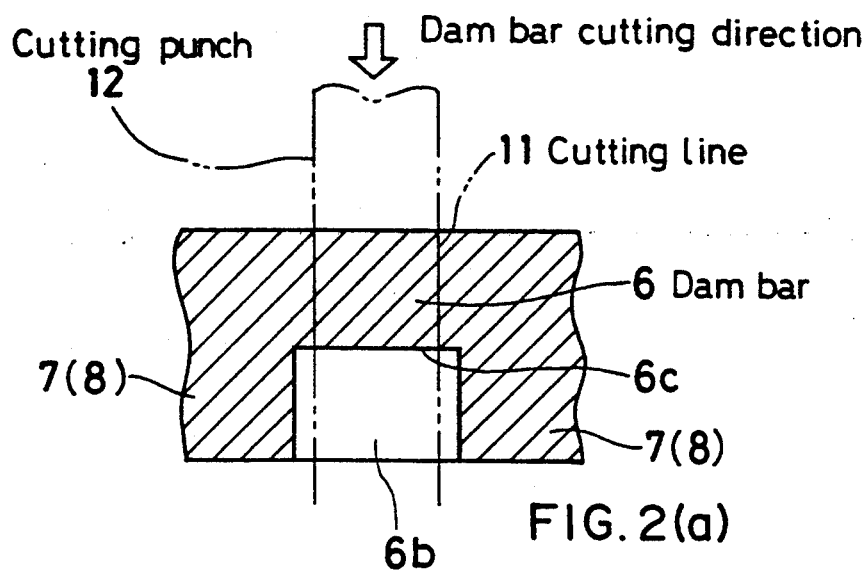
FIG. 2(a) shows a cross-section taken along the line IIA—IIA in FIG. 1 before the dam bar is cut.

The semiconductor element 3 is mounted on and rigidly bonded to the die pad 4 by use of an Au-Si eutectic or an electrically conductive or insulating paste. Next, the electrode pads 3a on the semiconductor element 3 and the corresponding inner leads 7 are bonded through the respective wires 9 of Au or Cu by wire bonding technique. Thereafter, a portion of the leadframe 1 which is defined with a molding line 10 is sealed with a molding resin material by transfer molding. After the resin material that is present in between each dam bar 6 and the molding line 10 is cut off, the dam bar 6 is cut along a cutting line 11 with a cutting punch 12, as shown in FIG. 2(a). As can be seen from FIG. 1, the cutting line 11 extends adjacent the edge of the inner and outer leads and parallel to the extension of the leads. Finally, the outer leads 8 are bent into a desired shape, thus completing a semiconductor device comprising the semiconductor element 3 packaged on the leadframe 1.

Incidentally, when the dam bar 6 is to be cut off, the resin material is cut off from the reverse side of the dam bar 6 with respect to the half-etched surface 6c and the dam bar 6 is thus cut off. According to this method, a relatively thin portion of the dam bar 6 forms the greater part of the portion that is to be cut off, as will be clear from FIGS. 1 and 2(a), so that the strength of the dam bar 6 is lowered. Accordingly, the dam bar 6 can be cut off more easily than if the portion 6b of the dam bar were the same thickness as the portion 6a. Thus, the incidence of chipping of the cutting punch 12 lowers, and the lifetime of the punch 12 lengthens.

Figure 2B:
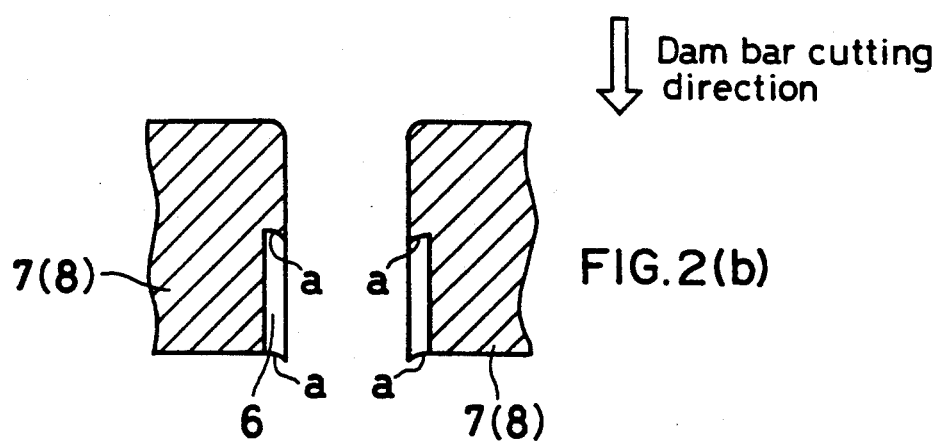
FIG. 2(b) shows the same cross-section after the dam bar has been cut.

Since the dam bar 6 can be readily cut off, shear droops a that are induced by cutting are relatively small, as shown in FIG. 2(b). Moreover, the resin burr on the half-etched surface 6c that is formed of the resin material overflowing into the half-etched portion 6b from the inside of the dam bar 6 is sandwiched between the half-etched portion 6b and the cutting die and brought into close contact with the surface roughened by the half-etching process. Accordingly, the adhesion of the resin material to the rough surface is better than that to other relatively smooth surfaces, so that the scattering of the resin material is minimized.

Figure 3A:
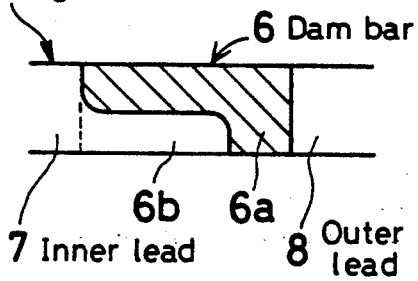
FIG. 3(a) is a sectional view taken along the line IIIA—IIIA in FIG. 1.
Figure 3B:
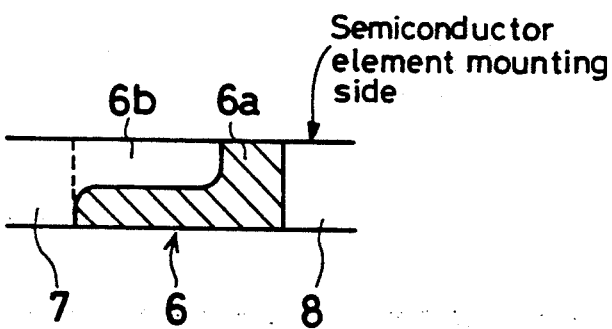
FIG. 3(b) is a sectional view of a dam bar which has a half-etched portion provided on the semiconductor element mounting side.
Figure 3C:
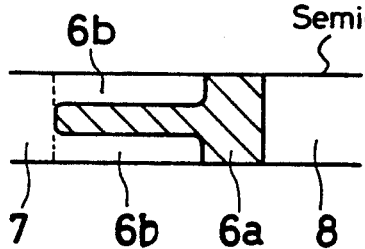
FIG. 3(c) is a sectional view of a dam bar which has a half-etched portion on each side thereof.

Although in the embodiment shown in FIG. 1 the half-etched portion 6b is formed in the reverse side of the leadframe 1 with respect to the side where the semiconductor element 3 is mounted, as shown in FIG. 3(a), it should be noted that the half-etched portion 6b may be formed in the semiconductor element mounting side, as shown in FIG. 3(b). It is also possible to provide the half-etched portion 6b in each side of the dam bar 6, as shown in FIG. 3(c). In this case, the thickness of the dam bar 6 is further reduced, so that the advantageous effects can be obtained even more surely.

Even if the dam bar 6 is cut from the side where the half-etched portion 6b is provided, almost the same advantageous effects as those described above are obtained.

Figure 4:
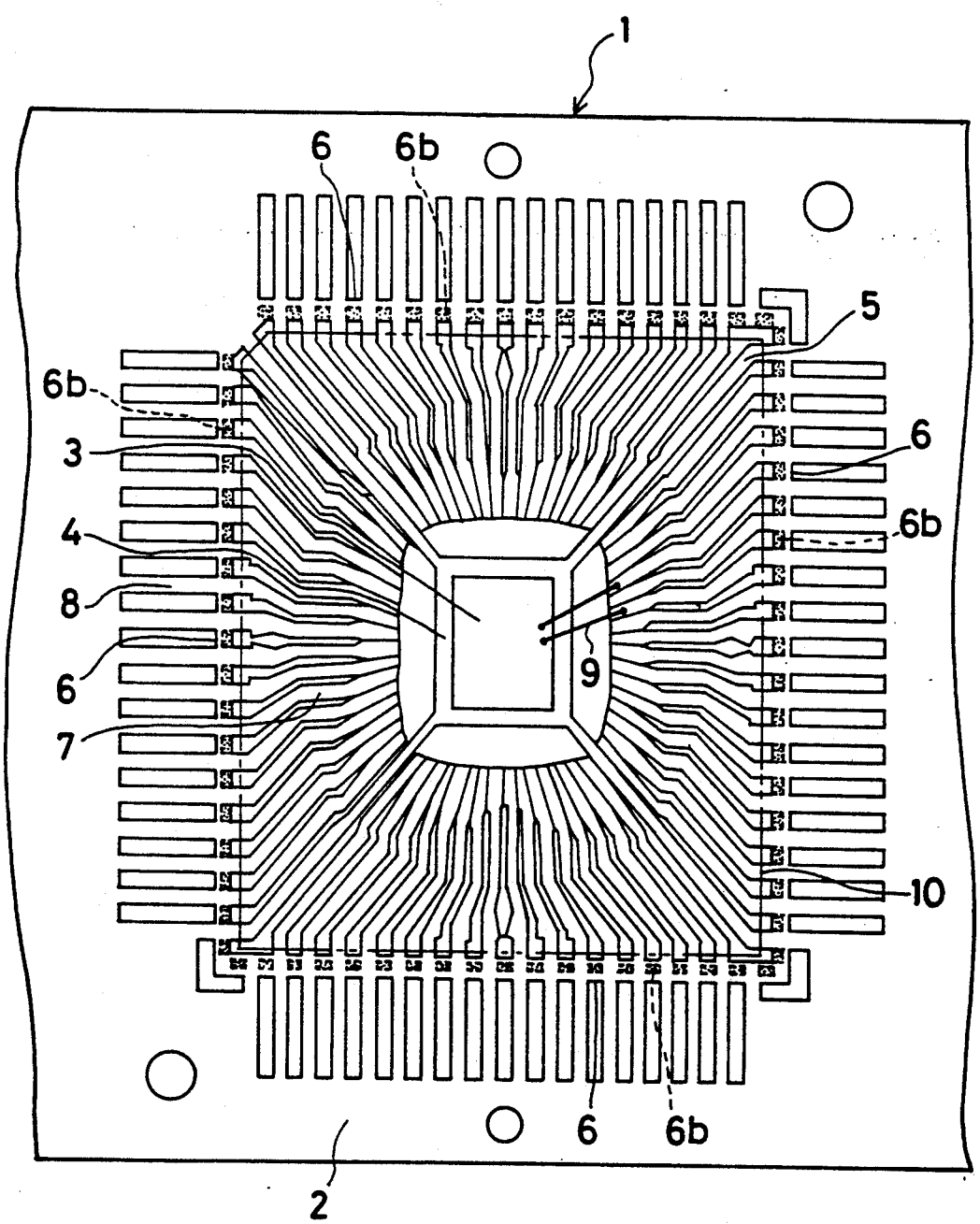
FIG. 4 is a plan view of a leadframe in a case where the embodiment is applied to a QFP (Quad Flat Package) type leadframe.

In addition, even if the half-etched portion 6b is formed in a QFP (Quad Flat Package) type leadframe 1 such as that shown in FIG. 4, the same advantages as those described above are obtained.

Figure 5:
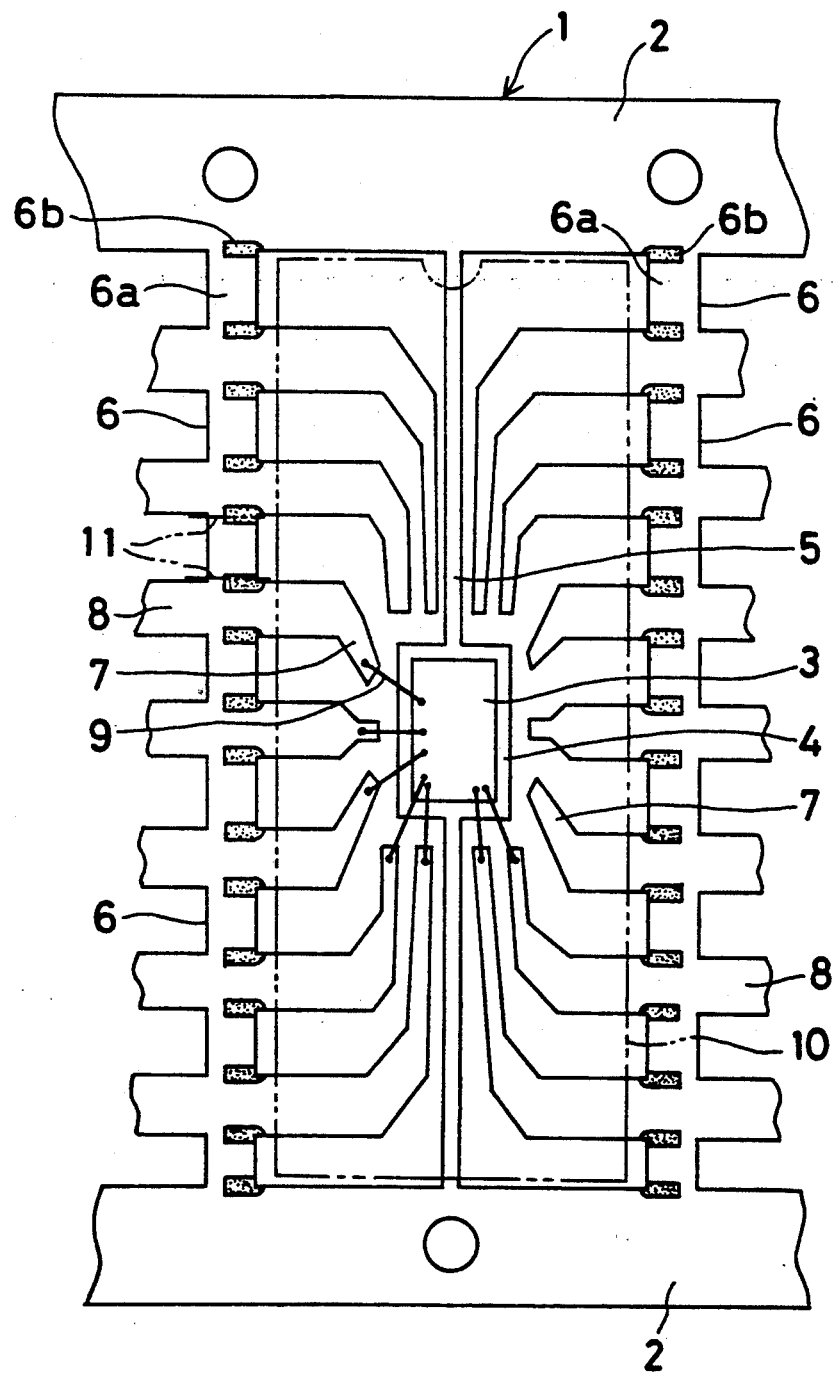
FIG. 5 is a plan view of another embodiment of the present invention.

FIG. 5 is a plan view of another embodiment of the present invention. It should be noted that the same constituent elements as those in the above-described embodiment are denoted by the same reference numerals and description thereof is omitted (the same is the case with embodiments described hereinafter).

As shown in FIG. 5, in this embodiment half-etched portions 6b are provided in the side where the semiconductor element 3 is mounted. In this case, the half-etched portions 6b are formed with a predetermined width in the dam bars 6, the inner leads 7 and the rails 2 along the imaginary lines connecting the edges of the inner leads 7 and the corresponding edges of the outer leads 8 and along the imaginary lines connecting the corresponding edges of the rails 2, with a part of each dam bar 6 which is closer to the outer leads 8 being left unetched.

Figure 6:
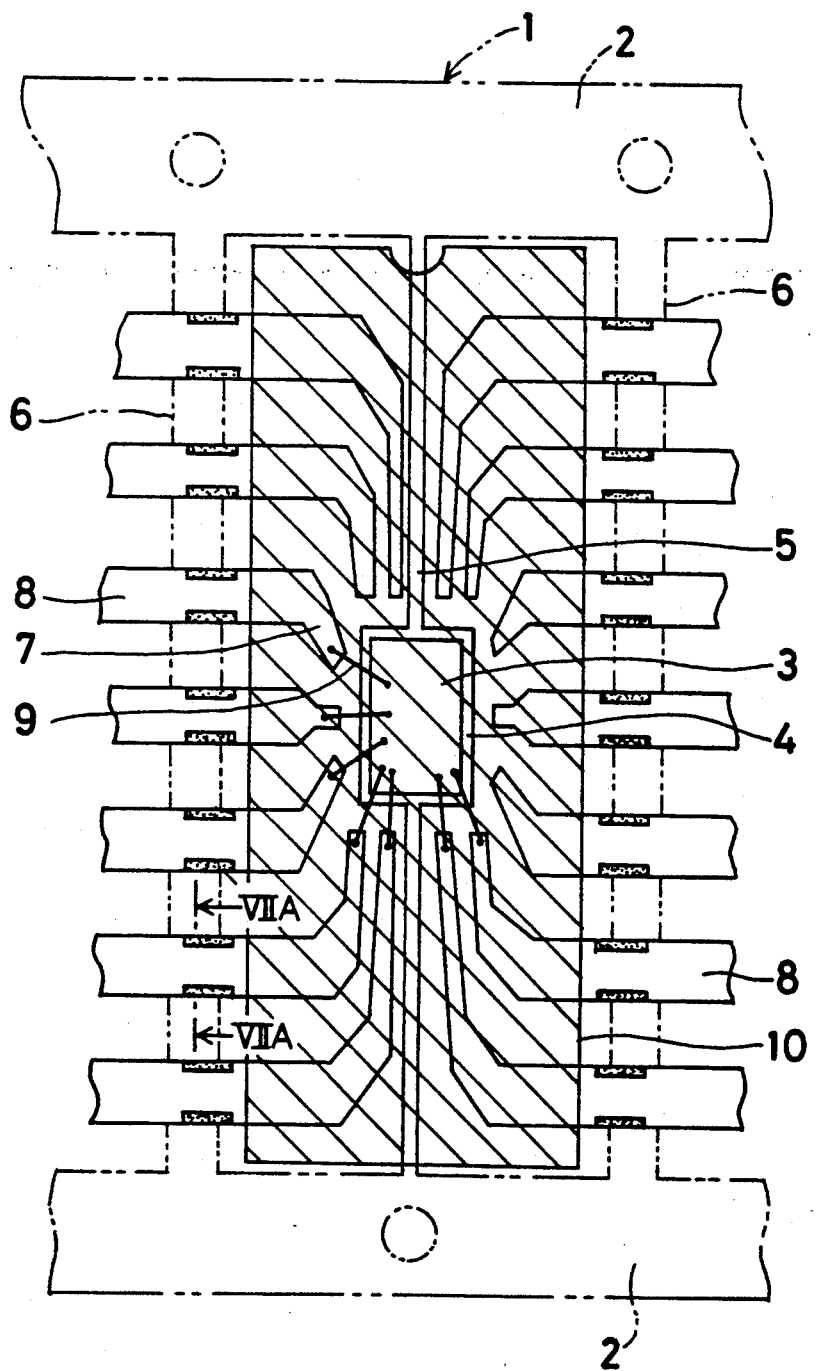
FIG. 6 is a plan view of a semiconductor device that employs the leadframe of this embodiment.

In this embodiment also, the semiconductor element 3 is mounted on the die pad 4 on the leadframe 1, and after the required wire bonding (shown by reference numeral 9) and resin molding are effected, the dam bars 6 are cut off along the cutting lines 11, thus completing a semiconductor device such as that shown by the solid lines in FIG. 6, in the same way as in the case of the above.

Figure 7A:
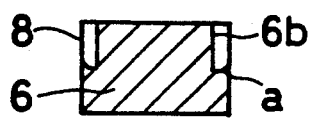
FIG. 7(a) is a sectional view taken along the line VIIA—VIIA in FIG. 6.

In this embodiment also, the same advantageous effects as those in the first-described embodiment are obtained, that is, the shear droops a that are induced by cutting are small, as shown in FIG. 7(a).

Figure 7B:
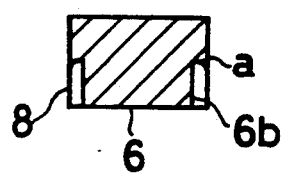
FIG. 7(b) is a sectional view of a dam bar which has a half-etched portion provided on the semiconductor element mounting side.
Figure 7C:
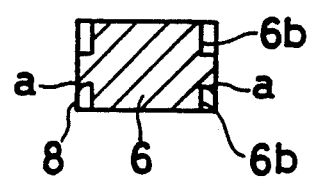
FIG. 7(c) is a sectional view of a dam bar which has a half-etched portion on each side thereof.

In addition, the half-etched portions 6b in this embodiment may also be provided in the reverse side of the leadframe 1 with respect to the side where the semiconductor element 3 is mounted, or in each side of the leadframe 1. In these cases also, the shear droops a are small, as shown in FIGS. 7(b) and 7(c).

Figure 8:
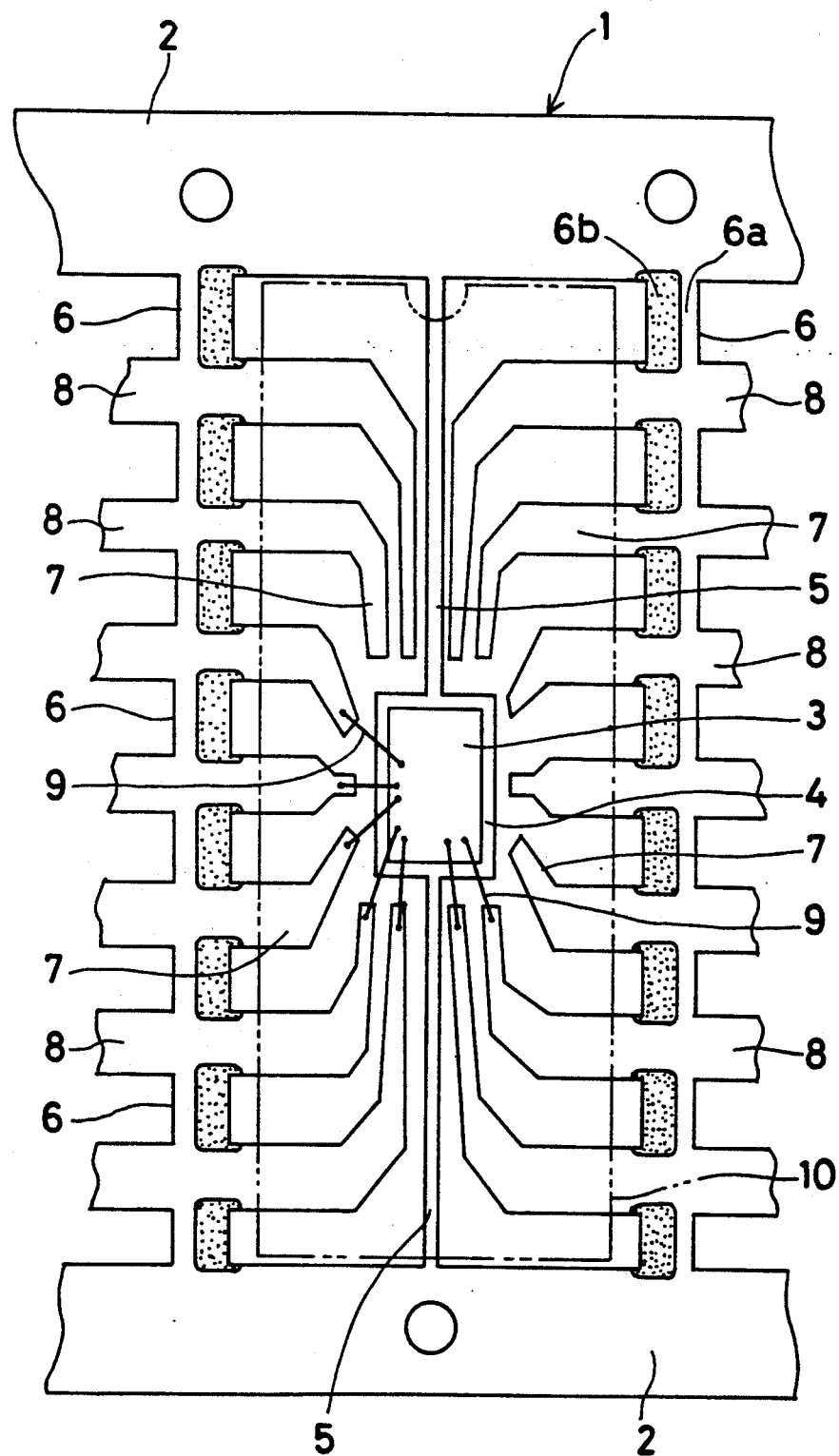
FIG. 8 is a plan view of still another embodiment of the present invention.

FIG. 8 is a plan view of still another embodiment of the present invention.

In this embodiment, the half-etched portions 6b are formed over the whole area of each dam bar 6 and along the imaginary lines connecting the corresponding edges of the inner leads 7 and the outer leads 8 by effecting etching from the side where the semiconductor element 3 is mounted, with a part of each dam bar 6 which is closer to the outer leads 8 being left unetched, as shown in FIG. 8. With this arrangement, it is possible to obtain the same advantageous effects as those in the foregoing embodiments.

Figure 9:
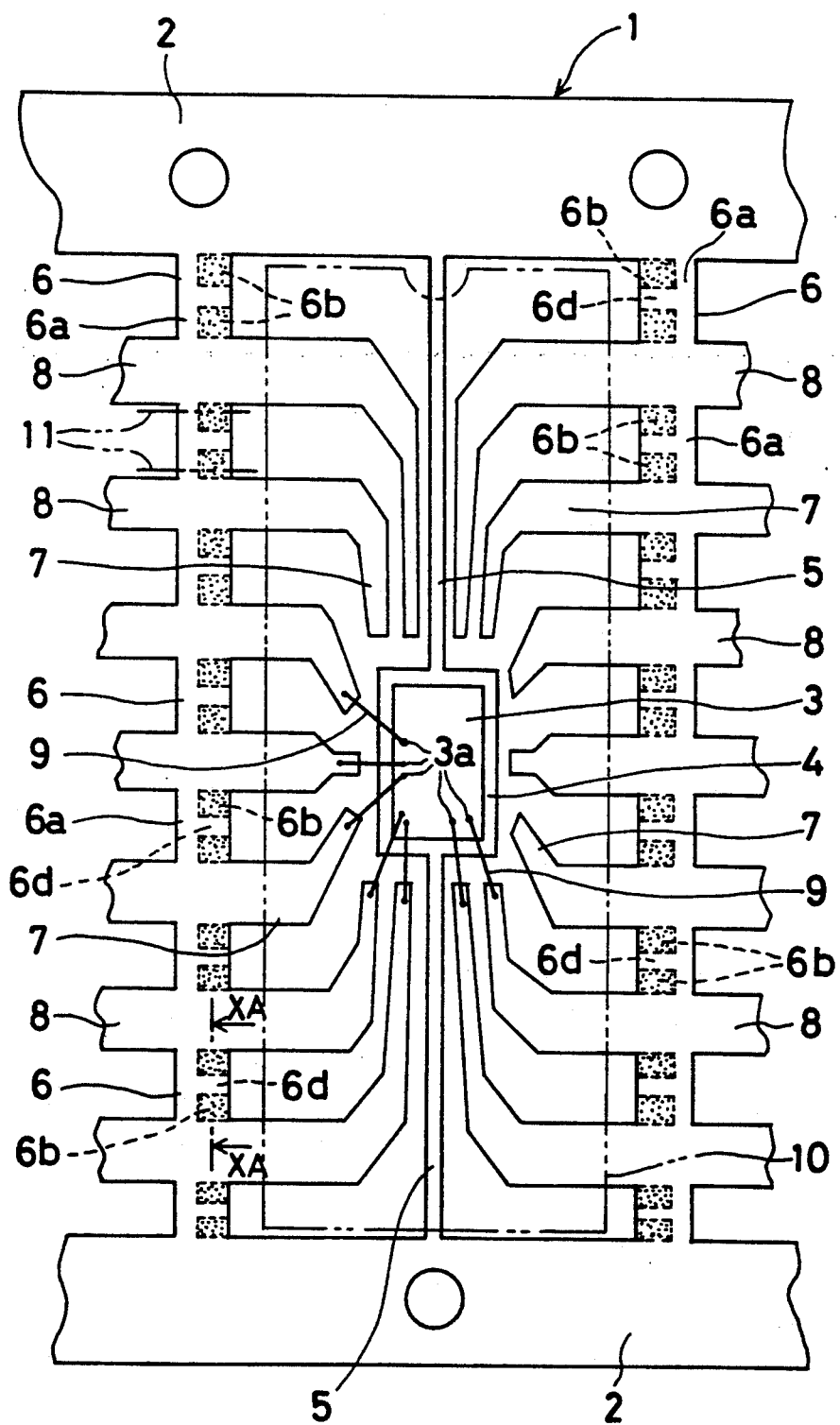
FIG. 9 is a plan view of a further embodiment of the present invention.
Figure 10A:
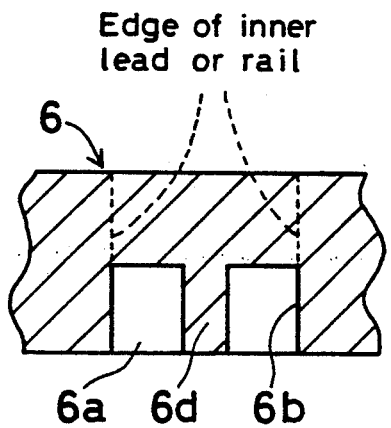
FIG. 10A is a sectional view taken along the line XA—XA in FIG. 9.

FIG. 9 is a plan view of a further embodiment of the present invention, and FIG. 10A is a sectional view taken along the line XA—XA in FIG. 9.

As shown in FIGS. 9 and 10A, in this embodiment the half-etched portions 6b are formed in the reverse side of each dam bar 6 with respect to the side where the semiconductor element 3 is mounted, as well as the embodiment shown in FIG. 1. In this case, however, the central portion 6d of the dam bar 6 is unetched to define a thick-walled portion that has a peninsular shape. The thickness of the central portion 6d is the same as that of the leadframe 1. The thick-walled central portion 6d serves to support the thin-walled portion of the dam bar 6 when cut with a punch, so that the dam bar 6 will hardly tilt. Accordingly, the operation of cutting the dam bar 6 can be conducted stably without undesired movement of the dam bar 6. In addition, the stress that is imposed on the leadframe 1 can be controlled so as to be well balanced. Thus, it is possible to cut off the dam bar 6 accurately with little deformation of the leadframe 1.

The leadframe 1 of this embodiment also provides the same advantageous effects as those in the foregoing embodiments, as a matter of course.

Figure 10B:
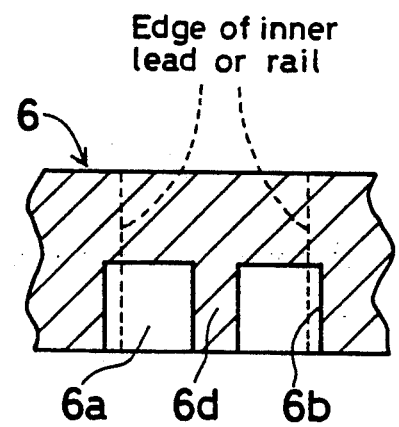
FIG. 10B is a sectional view taken along the line XB—XB in FIG. 11.
Figure 11:
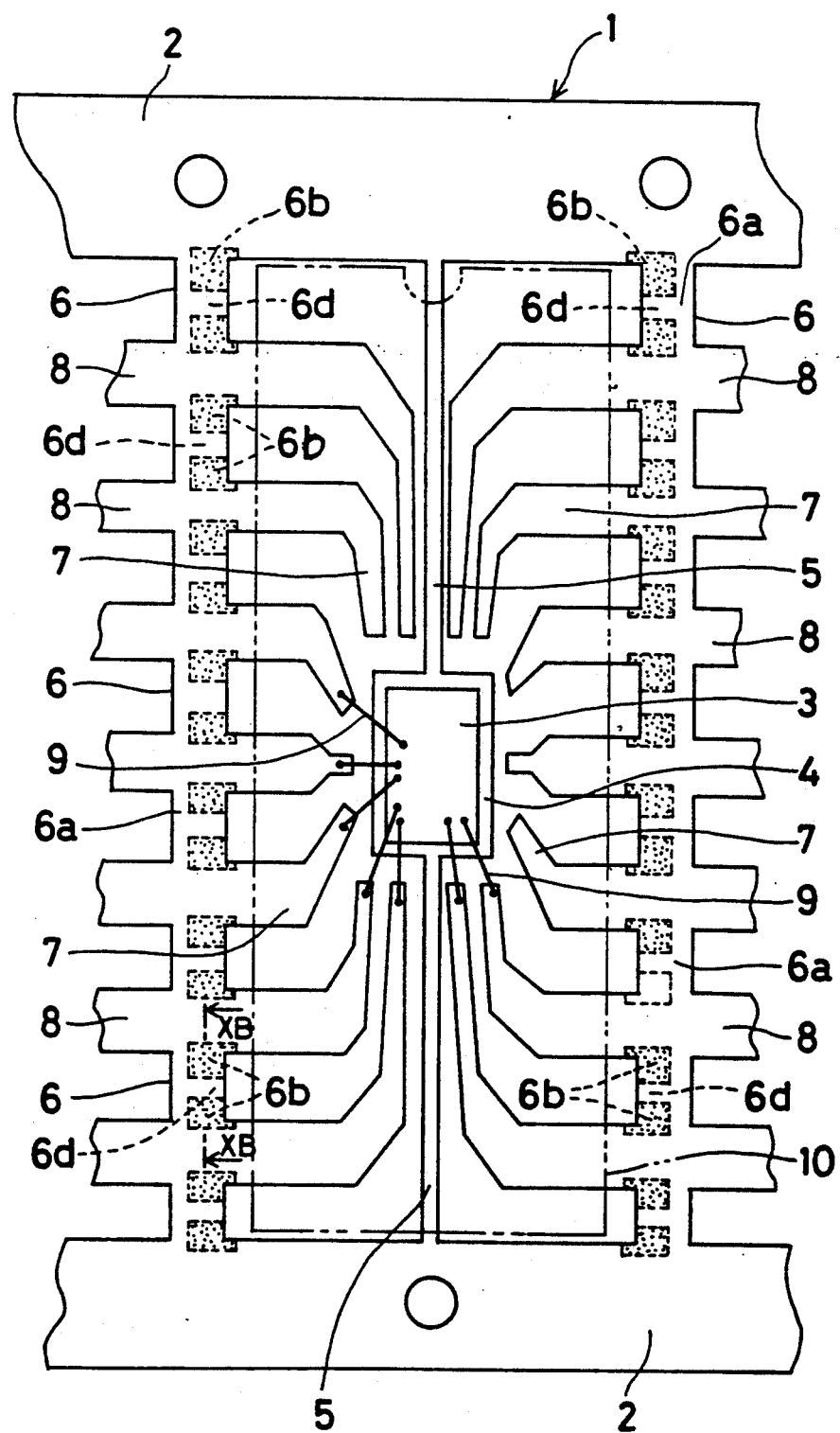
FIG. 11 is a plan view of a still further embodiment of the present invention.

FIG. 11 is a plan view of a still further embodiment of the present invention, and FIG. 10B is a sectional view taken along the line XB—XB in FIG. 11.

As shown in FIGS. 11 and 10B, this embodiment is substantially the same as the embodiment that is shown in FIG. 5. In this embodiment, however, the half-etched portions 6b are formed in the reverse side of the leadframe 1 with respect to the side where the semiconductor element 3 is mounted. More specifically, the half-etched portions 6b are formed with a predetermined width in the dam bars 6, the inner leads 7 and the rails 2 along the imaginary lines connecting the edges of the inner leads 7 and the corresponding edges of the outer leads 8 and along the imaginary lines connecting the corresponding edges of the rails 2. The width of the portion of each half-etched portion 6b which is formed in the dam bar 6 is set to be larger than in the case of the embodiment that is shown in FIG. 5. The central portion 6d of the dam bar 6 is left unetched to define a thick-walled portion. The advantages of this embodiment are the same as those of the embodiment that is shown in FIG. 9.

Figure 10C:
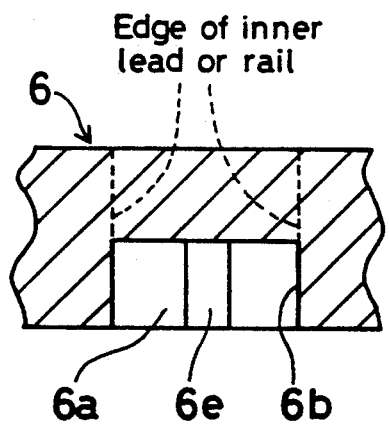
FIG. 10C is a sectional view taken along the line XC—XC in FIG. 12.
Figure 12:
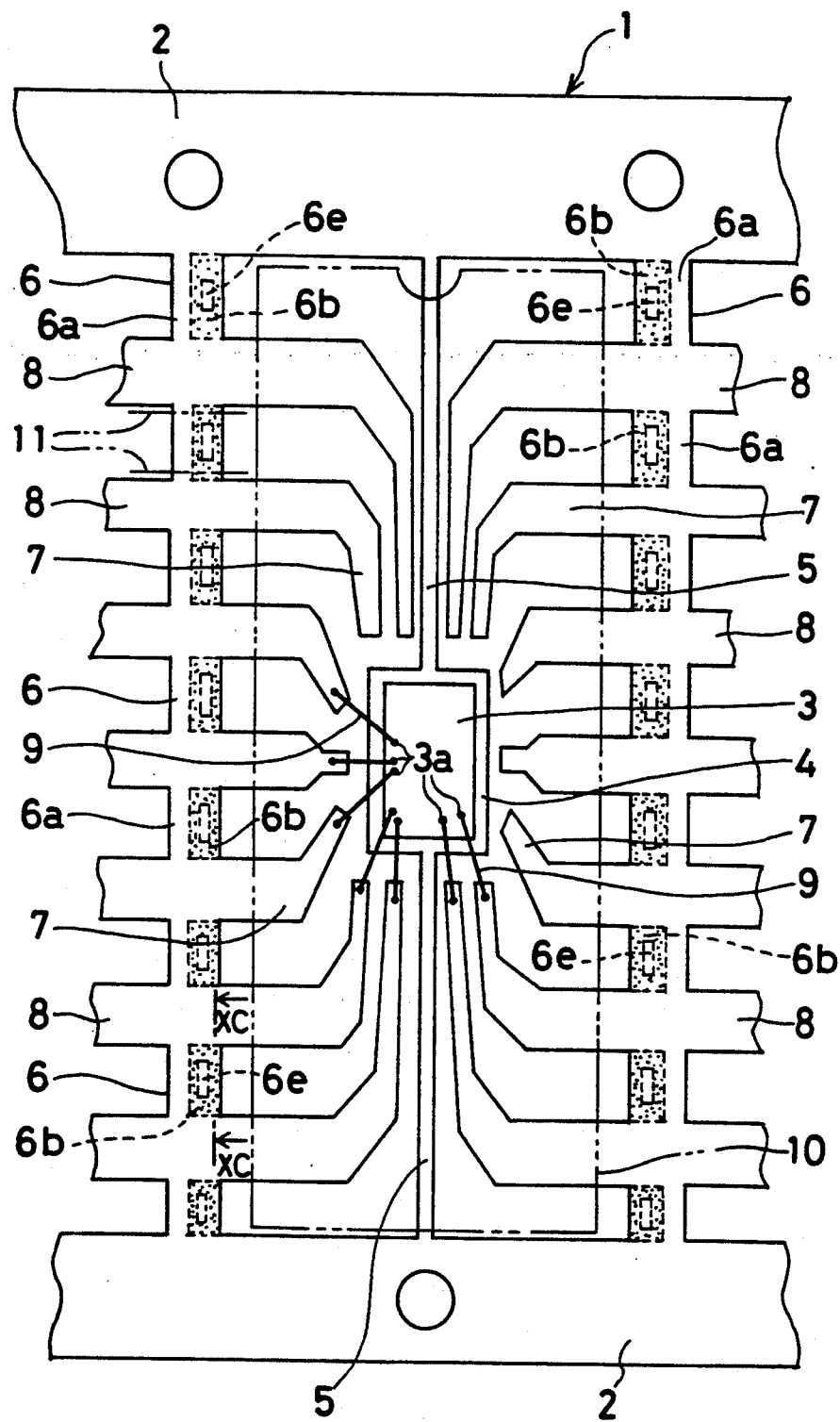
FIG. 12 is a plan view of a still further embodiment of the present invention.

FIG. 12 is a plan view of a still further embodiment of the present invention, and FIG. 10C is a sectional view taken along the line XC—XC in FIG. 12.

As shown in FIGS. 12 and 10C, this embodiment is substantially the same as the embodiment that is shown in FIG. 1. In this embodiment, however, the central portion 6e of each half-etched portion 6b in the dam bar 6 is left unetched to define a thick-walled portion that has an island-like shape. The advantages of this embodiment are the same as those of the embodiment that is shown in FIG. 9.

Figure 10D:
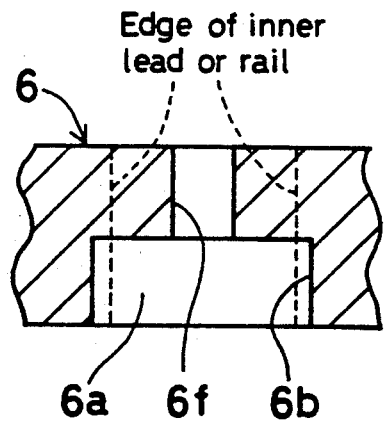
FIG. 10D is a sectional view taken along the line XD—XD in FIG. 13.
Figure 13:
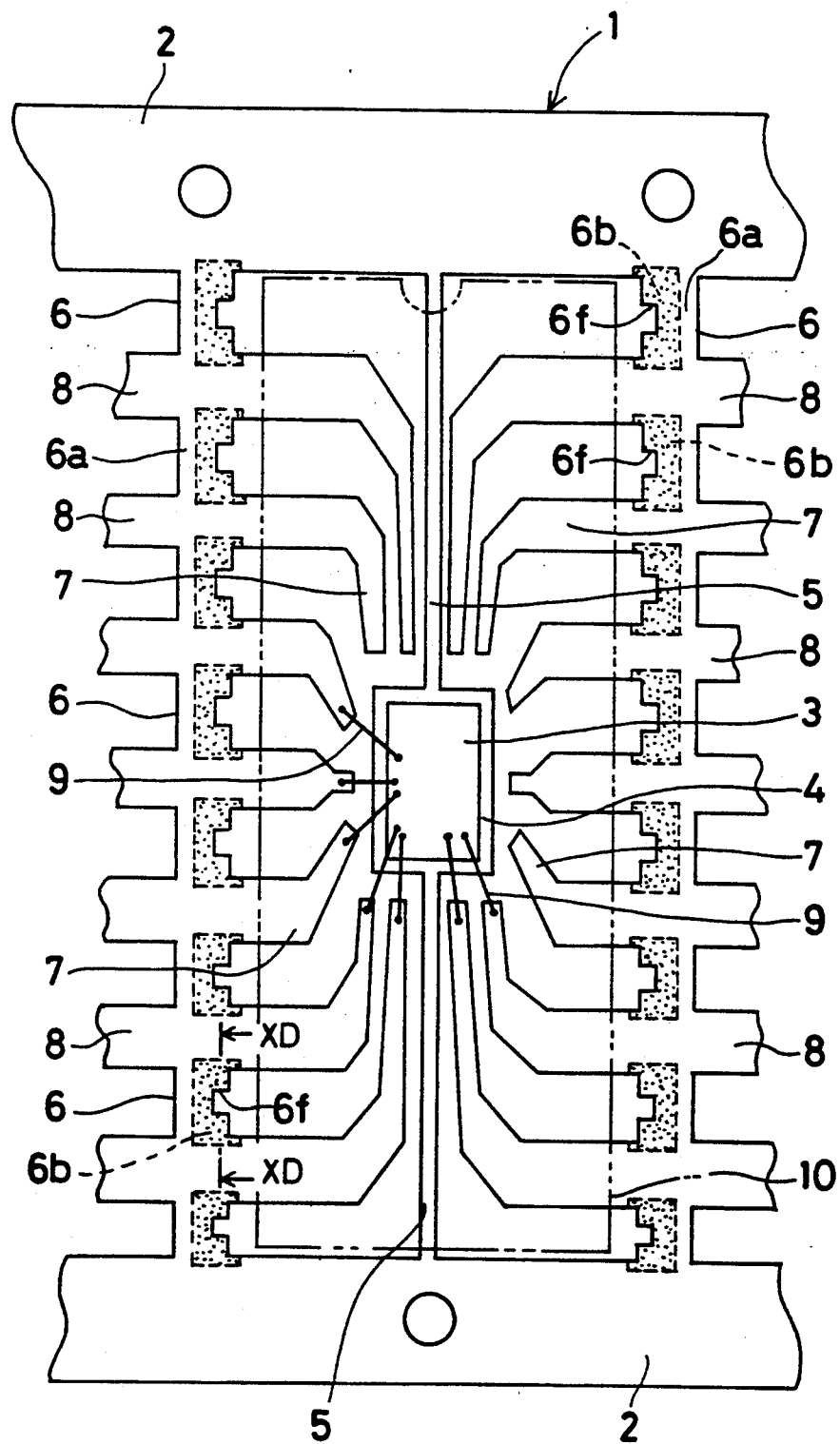
FIG. 13 is a plan view of a still further embodiment of the present invention.

FIG. 13 is a plan view of a still further embodiment of the present invention, and FIG. 10D is a sectional view taken along the line XD—XD in FIG. 13.

As shown in FIGS. 13 and 10D, this embodiment is substantially the same as the embodiment that is shown in FIG. 8. In this embodiment, however, the half-etched portions 6b are formed in the reverse side of the leadframe 1 with respect to the side where the semiconductor element 3 is mounted. In addition, a notch 6f is formed in each half-etched portion 6b of the dam bar 6. The notch 6f absorbs distortion of the dam bar 6 that is caused by the stress imposed on the dam bar 6 when cut off with a punch. Accordingly, the deformation of the leadframe 1 is reduced furthermore. The other advantages of this embodiment are the same as those of the embodiment that is shown in FIG. 9.

Figure 14:
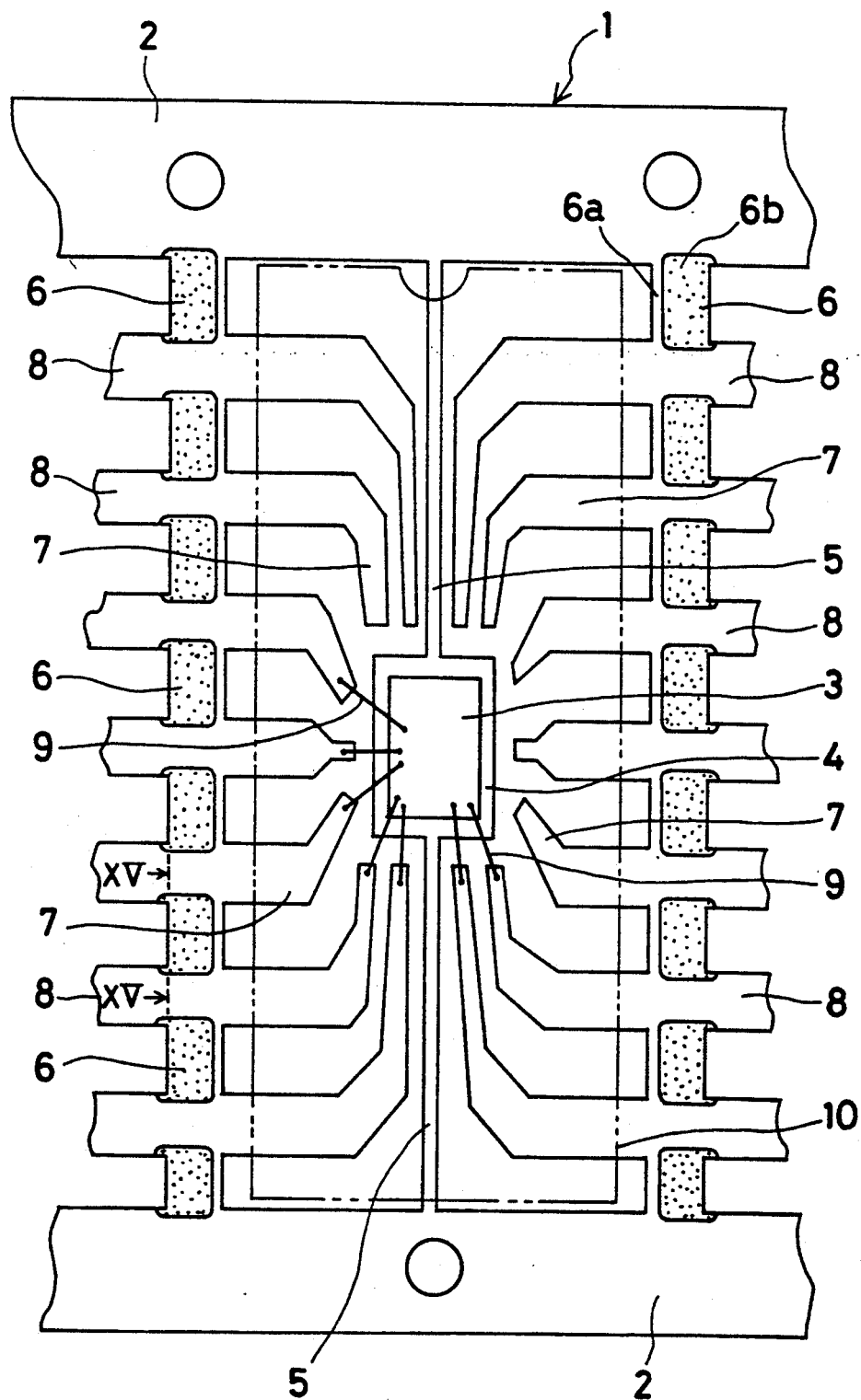
FIG. 14 is a plan view of a still further embodiment of the present invention.

FIG. 14 is a fragmentary plan view of a still further embodiment of the present invention.

Figure 15A:
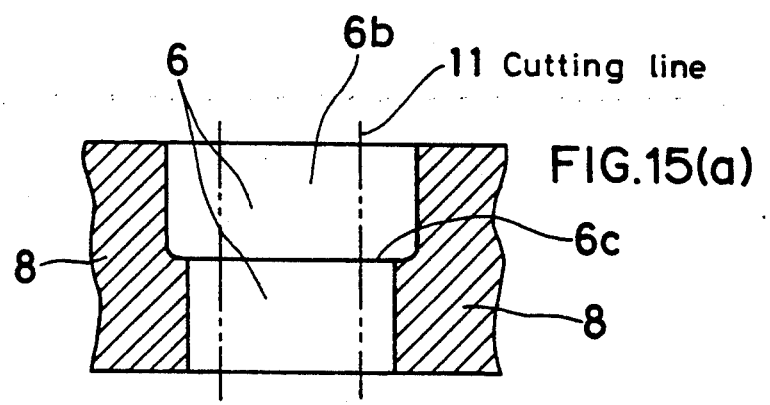
FIG. 15(a) shows the cross-section before the dam bar is cut.

As shown in FIGS. 14 and 15, the leadframe 1 is half-etched in such a manner that a portion 6a of each dam bar 6 which is closer to the inner leads 7 is left unetched with a predetermined length (e.g., 0.05 mm), while the other portion 6b is etched to a predetermined depth (e.g., 0.08 mm). Accordingly, the portion 6b, which is a half-etched portion of the dam bar 6, forms a thin-walled portion with a relatively small thickness.

When this dam bar 6 is to be cut off, the resin material is cut off from the reverse side of the dam bar 6 with respect to the half-etched surface 6c and the dam bar 6 is thus cut off. According to this method, a relatively thin portion of the dam bar 6 forms the greater part of the portion that is to be cut off, as will be clear from FIG. 15(a), so that the strength of the dam bar 6 is lowered. Accordingly, the dam bar 6 can be cut off with ease. Thus, the incidence of chipping of the cutting punch lowers, and the lifetime of the punch lengthens.

Figure 15B:
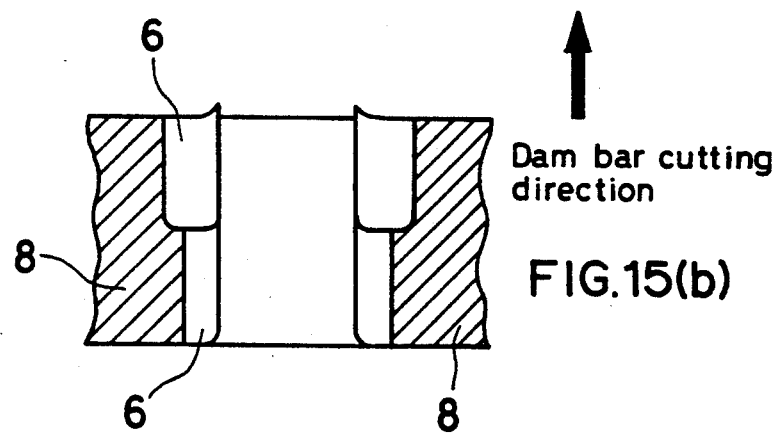
FIG. 15(b) shows the same cross-section after the dam bar has been cut.

Since the dam bar 6 can be readily cut off, shear droops that are induced by cutting are relatively small, as shown in FIG. 15(b). Moreover, the resin burr on the half-etched surface 6c that is formed of the resin material overflowing into the half-etched portion 6b from the inside of the dam bar 6 is sandwiched between the half-etched portion 6b and the cutting die and brought into close contact with the surface roughened by the half-etching process. Accordingly, the adhesion of the resin material to the rough surface is better than that to other relatively smooth surfaces, so that the scattering of the resin material is minimized.

In this case, the half-etched portion 6b may be formed in the semiconductor element mounting side of the leadframe 1, as shown in FIG. 14, or may be formed in the reverse side of the leadframe 1 with respect to the semiconductor element mounting side.

Even if the dam bar 6 is cut from the side where the half-etched portion 6b is provided, almost the same advantageous effects as those described above are obtained.

Figure 16:
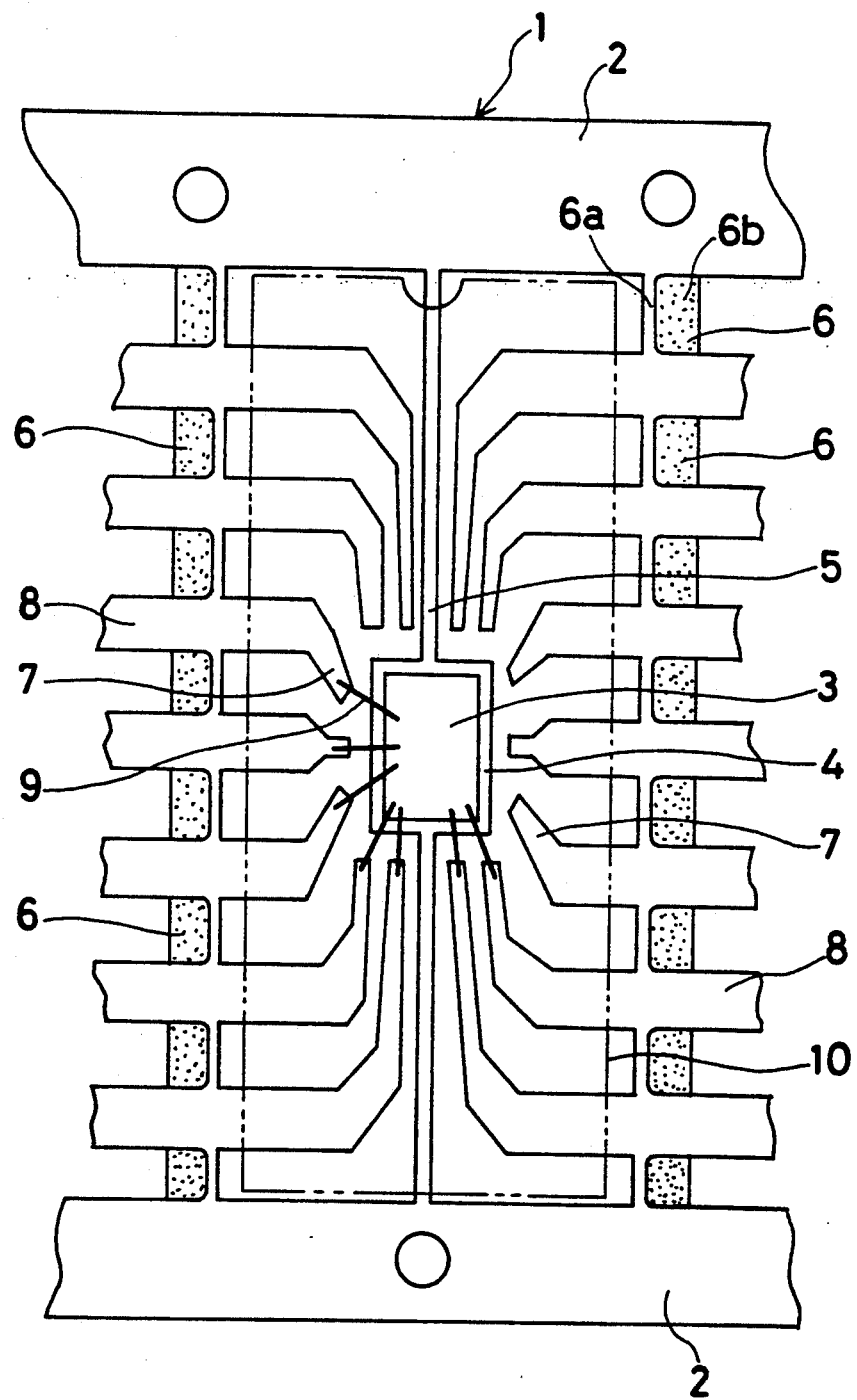
FIG. 16 is a plan view of a still further embodiment of the present invention.

FIG. 16 is a plan view of a still further embodiment of the present invention.

As shown in FIG. 16, in this embodiment each half-etched portion 6b is formed within the range that is defined between the lines connecting the corresponding edges of the inner and outer leads 7 and 8, with a part of the inner side of the dam bar 6 being left unetched. In this embodiment also, the same advantages as those of the foregoing embodiments are obtained.

Figure 17:
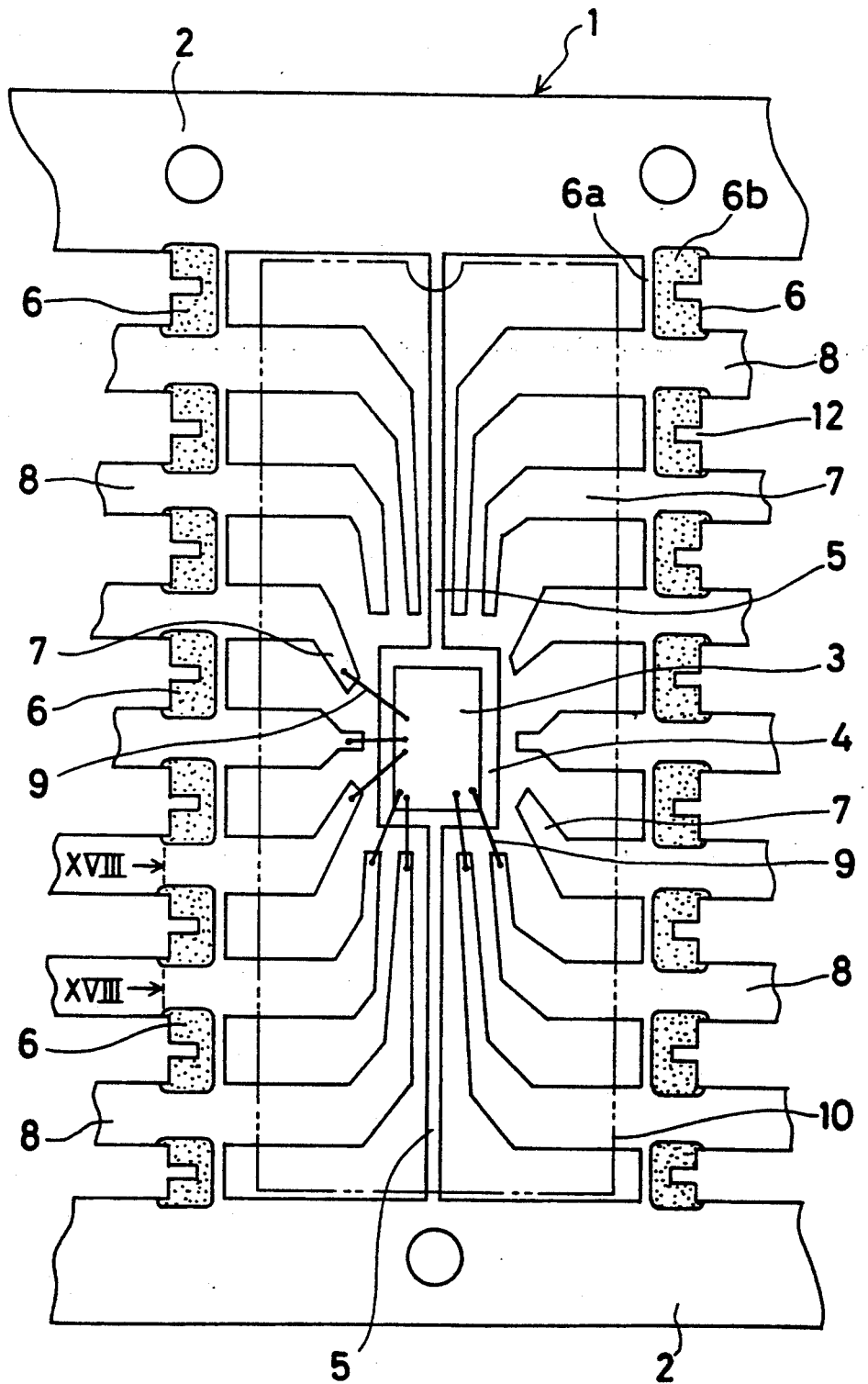
FIG. 17 is a sectional view of a still further embodiment of the present invention.
Figure 18A:
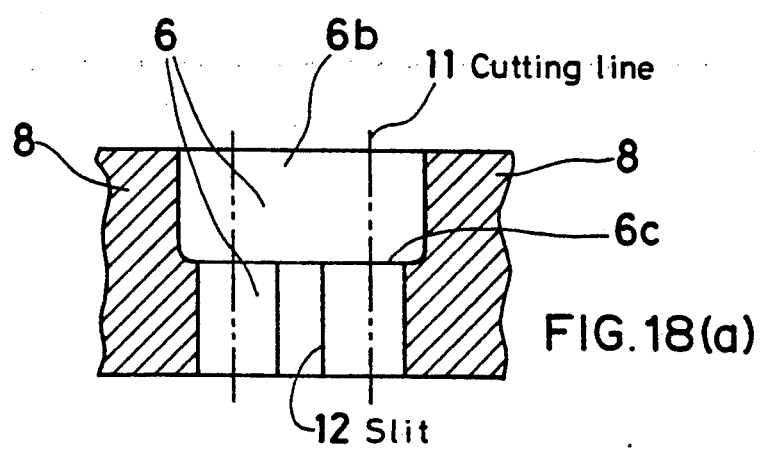
FIG. 18(a) shows the cross-section before the dam bar is out.
Figure 18B:
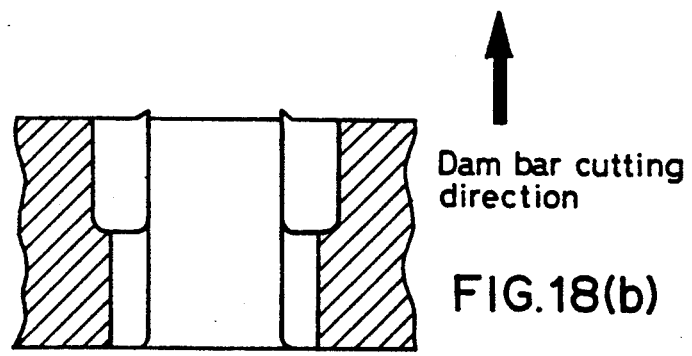
FIG. 18(b) shows the same cross-section after the dam bar has been cut.

FIGS. 17 and 18 show a still further embodiment of the present invention. It should be noted that the same constituent elements as those in the foregoing embodiments are denoted by the same reference numerals and description thereof is omitted.

As shown in FIGS. 17 and 18(a), in this embodiment a slit 12 with a predetermined width (e.g., 0.1 mm) is formed in each dam bar portion 6b that is formed by half-etching process.

The slit 12 enables the dam bar 6 to be cut off even more easily. Accordingly, the lifetime of the cutting punch can be further extended and the occurrence of shear droop and the scattering of the resin material can be prevented even more effectively.

Figure 19:
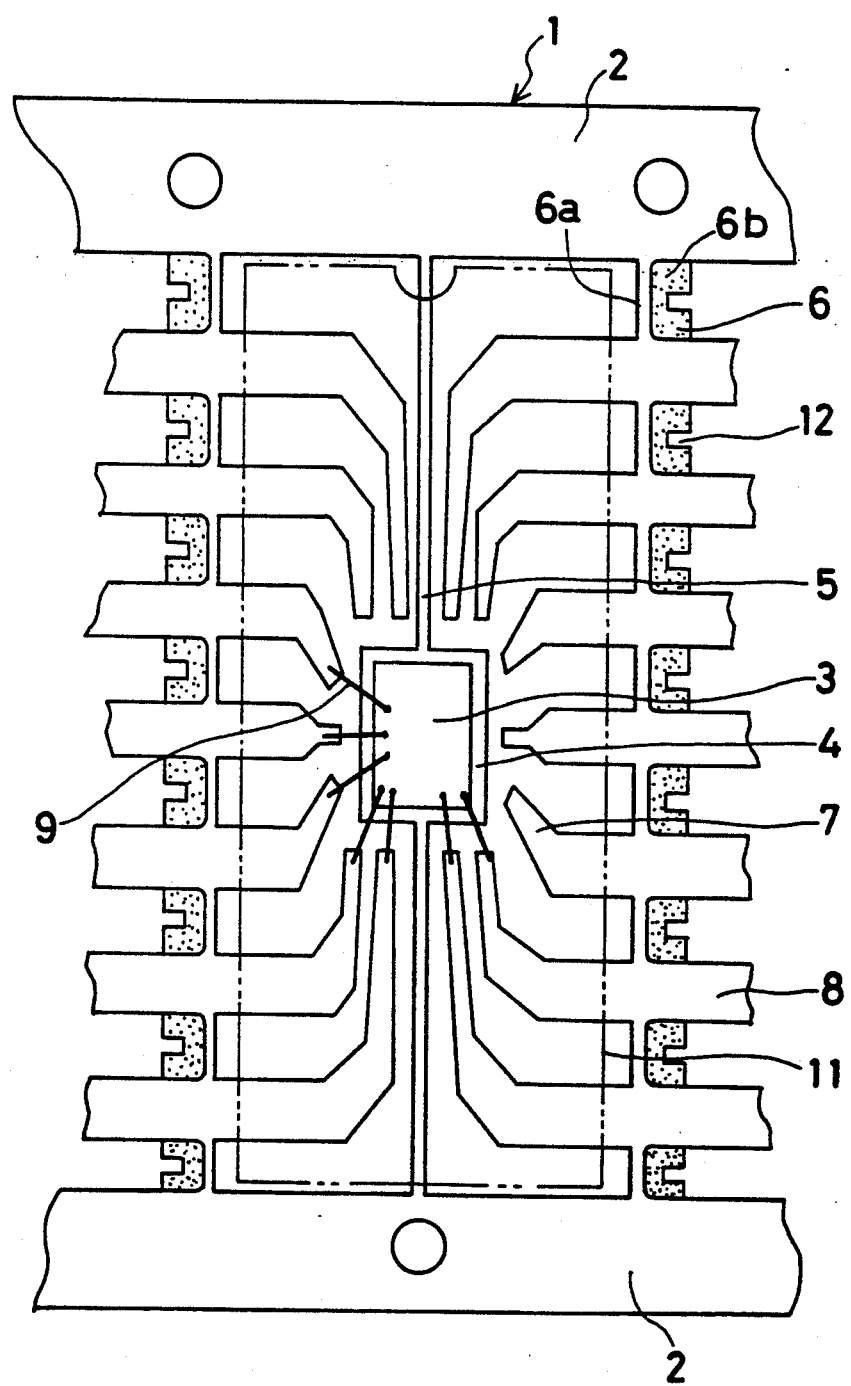
FIG. 19 is a sectional view of a still further embodiment of the present invention.

FIG. 19 is a plan view of a still further embodiment of the present invention.

As shown in FIG. 19, in this embodiment each half-etched portion 6b is formed within the range that is defined between the lines connecting the corresponding edges of the inner and outer leads 7 and 8, with a part of the inner side of the dam bar 6 being left unetched, in the same way as in the embodiment that is shown in FIG. 16. In this embodiment also, the same advantages as those of the embodiment that is shown in FIG. 17 are obtained.

Figure 20:
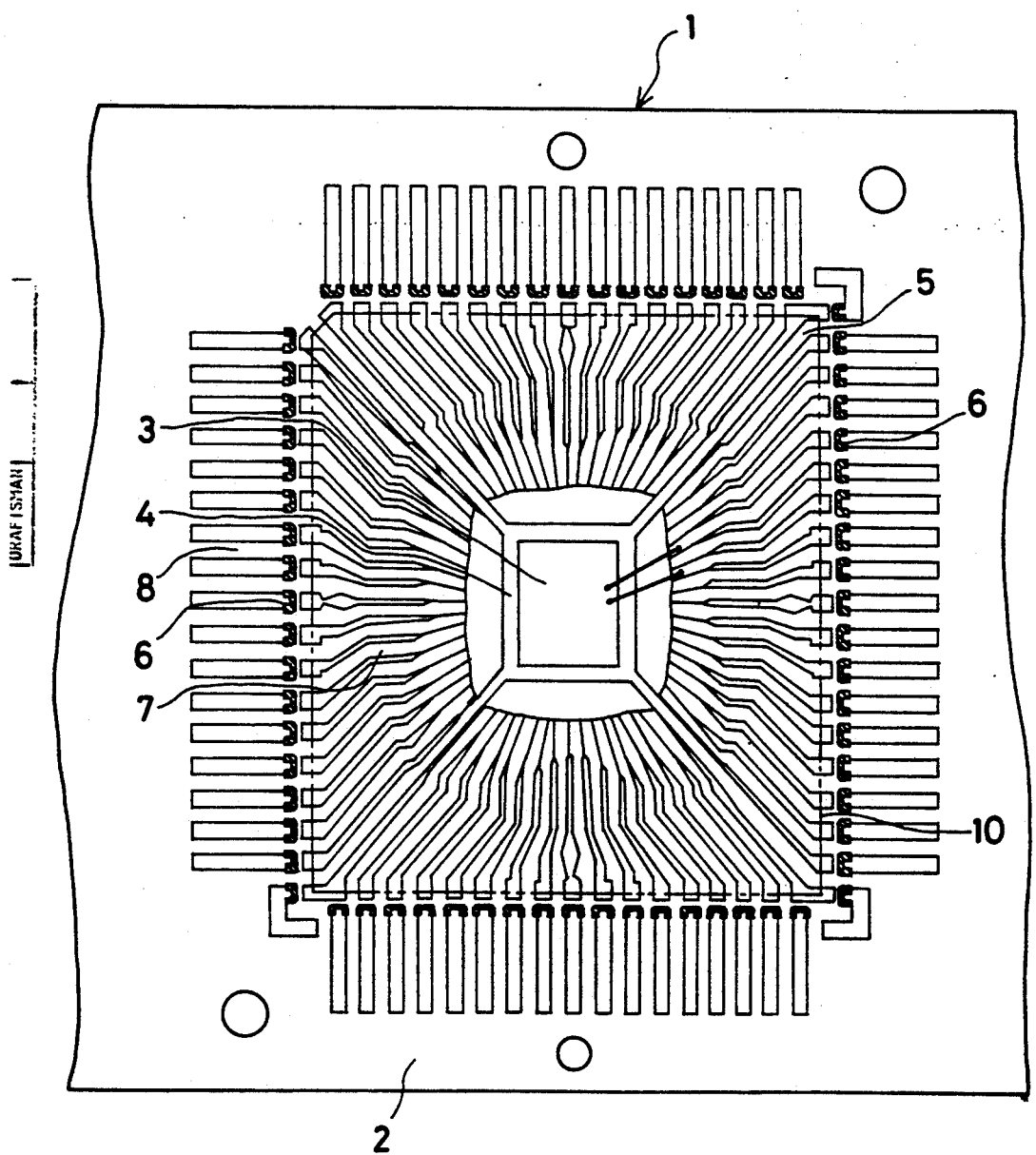
FIG. 20 is a plan view of another type of leadframe according to the present invention.
Figure 21A:
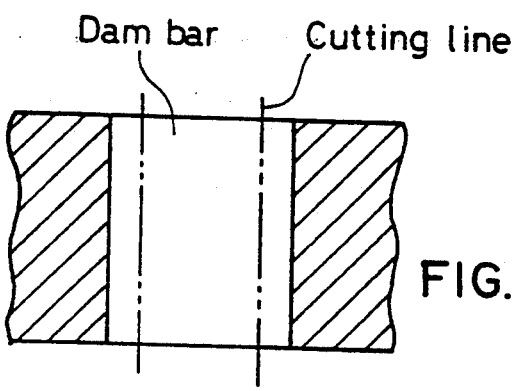
FIG. 21(a) shows the cross-section before the dam bar is cut.
Figure 21B:
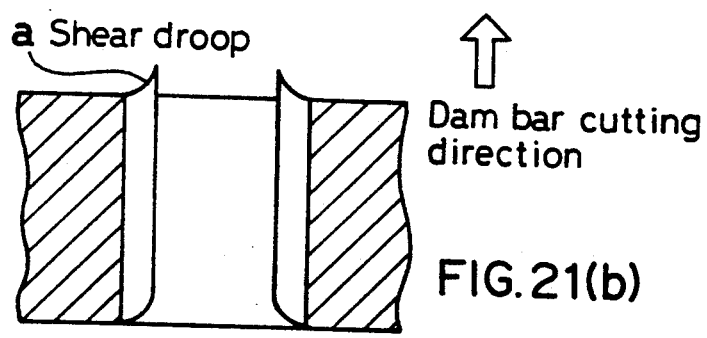
FIG. 21(b) shows the same cross-section after the dam bar has been cut.

It should be noted that the leadframes of the embodiments that are shown in FIGS. 14 to 19 can also be applied to a QFP (Quad Flat Package) type leadframe 1 that is shown in FIG. 20, in the same way as the above. In this case also, the same advantages are obtained.

Although the present invention has been described above by way of various embodiments in which the present invention is applied to a leadframe for mounting a semiconductor element, it should be noted that the present invention is not necessarily limitative thereto and that it is, as a matter of course, possible to apply the present invention to leadframes for mounting various kinds of electronic parts.

As will be clear from the foregoing description, it is possible according to the leadframe of the present invention to minimize the stress imposed on the cutting punch even if the lead pitch becomes small and the dam bar cutting width becomes small correspondingly, and hence possible to extend the lifetime of the cutting punch.

Since the dam bar can be cut off easily, the resulting shear droops are small. Accordingly, substantially no burr is left and it is therefroe possible to obtain a product with an extremely fine appearance.

In addition, the thin-walled portions, which are formed by half-etching process, enable prevention of the scattering of the resin burr when the dam bar is cut off, thus making it possible to reduce the incidence of dents in the leads and to obtain a semiconductor product of high reliability.

In addition, the thick-walled portion that is formed at the position where the thin-walled portion is formed enables the dam bar cutting operation to be conducted stably, so that the dam bar can be cut off accurately without deforming the leadframe.

What is claimed is:

1. A leadframe comprising a lead member having an inner lead portion and an outer lead portion and a dam bar projecting from the lead member at a location between the inner lead portion and the outer lead portion, the dam bar having a first portion and a second portion, said first portion being of greater thickness than said second portion whereby said second portion has a lower cutting strength than said first portion, and said first and second portions being traversed by a cutting line that extends closely adjacent to the lead member, the extent of said first portion of the dam bar along said cutting line being less than the extent of said second portion of the dam bar along said cutting line, whereby the dam bar can be cut along said cutting line more readily than if said second portion were as thick as said first portion.

2. A leadframe according to claim 1, wherein the lead member has a portion adjacent the dam bar and contiguous with the second portion of the dam bar, the thickness of said portion of the lead member being substantially equal to that of said second portion of the dam bar.

3. A leadframe having first and second adjacent lead members each comprising an inner lead portion and an outer lead portion, and a dam bar connecting the first and second lead members, the dam bar having a first portion and a second portion, said first portion being thicker then said second portion, and said first and second portions being traversed by a cutting line that extends closely adjacent to the edge of the first lead member, the extent of said first portion of the dam bar along said cutting line being less than the extent of said second portion of the dam bar along said cutting line, whereby the dam bar can be cut from the first lead member along said cutting line more readily than if said second portion were as thick as said first portion.

4. A leadframe according to claim 3, wherein the first lead member has a portion adjacent the dam bar and contiguous with the second portion of the dam bar, the thickness of said portion of the first lead member being substantially equal to that of said second portion of the dam bar.

5. A leadframe according to claim 3, wherein the first and second portions of the dam bar are traversed by a second cutting line that extends closely adjacent the edge of the second lead member, whereby the dam bar can be cut from the second lead member along said second cutting line more readily than if said second portion were as thick as said first portion.

6. A leadframe according to claim 5, wherein the second lead member has a portion adjacent the dam bar and contiguous with the second portion of the dam bar, the thickness of said portion of the second lead member being substantially equal to that of said second portion of the dam bar.

7. A leadframe comprising a plurality of lead members each having an inner lead portion and an outer lead portion, a rail adjacent one lead member, and dam bars projecting laterally from each lead member between said inner lead portion and said outer lead portion and connecting between said one lead member and said rail and between each pair of adjacent lead members, and wherein each dam bar has a first portion and a second portion in a region that includes a cutting line at the position of said dam bar adjacent to a lead member and extending along said lead member, said second portion of each dam bar is thinner than said first portion thereof and has a lower cutting strength than said first portion, and the width of said second portion in the direction of said cutting line is greater than the width of said first portion in the direction of said cutting line.

* * * * *